(12) United States Patent
Jung et al.

(10) Patent No.: US 9,056,765 B2
(45) Date of Patent: Jun. 16, 2015

(54) SEMICONDUCTOR PACKAGE AND MANUFACTURING METHOD THEREOF

(71) Applicant: Amkor Technology, Inc., Chandler, AZ (US)

(72) Inventors: Jong Dae Jung, Seoul (KR); Dong Hyun Bang, Seoul (KR); Yung Woo Lee, Anyang-si (KR); EunNaRa Cho, Seoul (KR); Byung Jun Kim, Hwaseong-si (KR)

(*) Notice: Subject to any disclaimer, the term of this patent is extended or adjusted under 35 U.S.C. 154(b) by 0 days.

(21) Appl. No.: 13/937,764

(22) Filed: Jul. 9, 2013

(65) Prior Publication Data
US 2014/0017843 A1  Jan. 16, 2014

(30) Foreign Application Priority Data
Jul. 10, 2012  (KR) .................. 10-2012-0074947

(51) Int. Cl.
| | | |
|---|---|---|
| G01R 31/26 | (2014.01) | |
| H01L 21/66 | (2006.01) | |
| B81C 1/00 | (2006.01) | |
| H01L 23/00 | (2006.01) | |
| H01L 23/055 | (2006.01) | |
| H01L 23/31 | (2006.01) | |
| B81B 7/00 | (2006.01) | |
| H01L 21/56 | (2006.01) | |

(52) U.S. Cl.
CPC ............ B81C 1/00269 (2013.01); H01L 21/565 (2013.01); H01L 24/97 (2013.01); H01L 2224/48137 (2013.01); H01L 2224/48145 (2013.01); H01L 2224/48091 (2013.01); H01L 2224/73265 (2013.01); H01L 2224/32145 (2013.01); H01L 2224/32225 (2013.01); H01L 23/055 (2013.01); H01L 23/3121 (2013.01); H01L 2224/97 (2013.01); H01L 2924/3025 (2013.01); B81B 7/0064 (2013.01); B81B 2207/012 (2013.01); B81C 2203/0118 (2013.01); H01L 2924/1461 (2013.01)

(58) Field of Classification Search
None
See application file for complete search history.

(56) References Cited

U.S. PATENT DOCUMENTS

| | | |
|---|---|---|
| 6,376,907 B1 | 4/2002 | Takano et al. |
| 6,479,323 B1* | 11/2002 | Lo et al. .................. 438/111 |
| 6,522,762 B1 | 2/2003 | Mulienborn et al. |
| 6,781,231 B2 | 8/2004 | Minervini |
| 7,166,910 B2 | 1/2007 | Minervini |
| 7,242,089 B2 | 7/2007 | Minervini |
| 7,381,049 B2 | 6/2008 | Li et al. |
| 7,381,589 B2 | 6/2008 | Minervini |
| 7,434,305 B2 | 10/2008 | Minervini |
| 7,439,616 B2 | 10/2008 | Minervini |
| 7,501,703 B2 | 3/2009 | Minervini |
| 7,537,964 B2 | 5/2009 | Minervini |
| 7,668,415 B2 | 2/2010 | Tyger |
| 8,018,049 B2 | 9/2011 | Minervini |
| 8,354,747 B1 | 1/2013 | Kuo |
| 2002/0070102 A1* | 6/2002 | Kawada et al. ........... 198/817 |

(Continued)

FOREIGN PATENT DOCUMENTS

KR    2009-0076818    7/2009

*Primary Examiner* — Charles Garber
*Assistant Examiner* — Abdulfattah Mustapha
(74) *Attorney, Agent, or Firm* — McAndrews, Held & Malloy

(57) ABSTRACT

Various aspects of the present invention, for example and without limitation, comprise a semiconductor device package and/or method for manufacturing a semiconductor device package. Such a device package may, for example, comprise a MEMS device package.

20 Claims, 6 Drawing Sheets

(56) References Cited

U.S. PATENT DOCUMENTS

| | | |
|---|---|---|
| 2004/0173887 A1* | 9/2004 | Jang et al. .................. 257/678 |
| 2006/0157841 A1 | 7/2006 | Minervini |
| 2007/0004083 A1 | 1/2007 | Chiu et al. |
| 2007/0007668 A1 | 1/2007 | Brandenburg et al. |
| 2007/0013052 A1 | 1/2007 | Zhe et al. |
| 2007/0090502 A1 | 4/2007 | Zhao et al. |
| 2007/0201715 A1* | 8/2007 | Minervini .................. 381/355 |
| 2007/0215962 A1 | 9/2007 | Minervini et al. |
| 2007/0222064 A1 | 9/2007 | Edwards et al. |
| 2007/0296075 A1 | 12/2007 | Kwon et al. |
| 2008/0150104 A1 | 6/2008 | Zimmerman et al. |
| 2010/0038733 A1 | 2/2010 | Minervini |
| 2010/0176509 A1 | 7/2010 | Murai et al. |

* cited by examiner

SEMICONDUCTOR PACKAGE AND MANUFACTURING METHOD THEREOF

CROSS-REFERENCE TO RELATED APPLICATIONS/INCORPORATION BY REFERENCE

The present application makes reference to, claims priority to, and claims the benefit of Korean Patent Application No. 10-2012-0074947, filed on Jul. 10, 2012, the contents of which are hereby incorporated herein by reference, in their entirety. The present application is also related to U.S. application Ser. No. 13/712,708, filed Dec. 12, 2012, and presently pending; and U.S. application Ser. No. 12/791,472, filed Jun. 1, 2010, and issued as U.S. Pat. No. 8,354,747.

FEDERALLY SPONSORED RESEARCH OR DEVELOPMENT

Not Applicable

SEQUENCE LISTING

Not Applicable

MICROFICHE/COPYRIGHT REFERENCE

Not Applicable

BACKGROUND

Present systems, methods and/or architectures for producing electronic packages with cavities are inefficient. Further limitations and disadvantages of conventional and traditional approaches will become apparent to one of skill in the art, through comparison of such approaches with the present invention as set forth in the remainder of the present application with reference to the drawings.

DETAILED DESCRIPTION OF VARIOUS ASPECTS OF THE INVENTION

Figure 1:
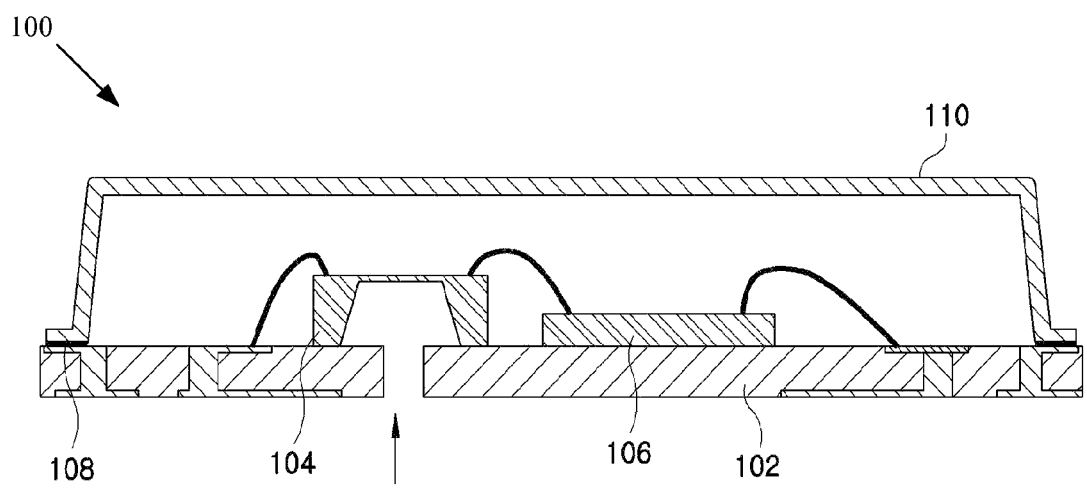
FIG. 1 shows a cross-sectional view of a semiconductor package.

Example embodiments will now be described more fully hereinafter with reference to the accompanying drawings. However, the various aspects of the present invention may be embodied in different forms, and thus the provided exemplary embodiments should not be construed as limiting. Common reference numerals may be used throughout the drawings and the detailed description to indicate the same or similar elements.

Various aspects of the present invention may relate, for example, to an electronic package and a manufacturing method thereof, and more particularly to a semiconductor package (e.g., a MEMS semiconductor package) and a manufacturing method thereof. Various aspects may, for example, simplify the manufacturing method of the semiconductor package having a lid to protect a cavity region to which a semiconductor chip or an active element of a MEMS microphone is attached, and can, for example, save manufacturing cost.

As a portable device, such as, for example, a mobile phone, a smart phone, a smart pad, a tablet PC, or the like, is used, electromagnetic wave interference (EMI) may unavoidably occur. For example, because of increasing demand for miniaturization of components employed to the device, the EMI may adversely affect other devices around the device, resulting in deterioration of device performance characteristics.

In the light of the foregoing, the tendency has led to increasing and widespread use of semiconductor packages employing EMI shielding structures. An example of a semiconductor package is illustrated in FIG. 1.

FIG. 1 shows a cross-sectional view of a semiconductor package 100. Referring to FIG. 1, a semiconductor chip 104, such as for example a microphone, and an active element 106, may be attached to a predetermined position on a substrate 102, that is, a cavity region. The semiconductor chip 104 and the active element 106 may be electrically connected to a circuit pattern (not shown) of the substrate 102 through one or more metal wires. Here, the arrow shown in FIG. 1 indicates a sound passage (or a sound groove).

In addition, the cavity region in which the semiconductor chip 104, the active element 106, and/or other components are positioned is sealed by a lid (or cover) 110 made of a metal material, such as copper. The lid 110 and the substrate 102 may be adhered to each other using an adhesive 108, e.g., a solder paste, conductive or non-conductive epoxy, etc.

In a case where the semiconductor chip 104 is a device requiring EMI shielding, such as a microphone, an EMI shielding layer may be formed within the lid 110.

The previously discussed semiconductor package 100 may be manufactured by attaching the semiconductor chip 104 and the active element 106 on the substrate 102, coating the adhesive 108 to an adhering portion of the lid 110, and aligning the adhering portion of the lid 110 on the target position of the substrate 102, followed by adhering. Here, the adhering of the lid 110 is performed by an operator coating the adhesive 108 on the adhering portion of the lid 110 and manually attaching the lid 110 to the substrate 102.

In an example semiconductor package manufacturing method, when 200 semiconductor packages are to be manufactured, an operator might manually perform lid adhesion 200 times. For the semiconductor package 100 shown in FIG. 1, it might be necessary for the operator to manually attach the lid 110 to the substrate 102, making the assembling process complicated and increasing the manufacturing cost of the semiconductor package.

Various aspects of the present invention provide a semiconductor package, which can be assembled in an efficient manner and can reduce the manufacturing cost.

Various aspects of the present invention also provide a manufacturing method of a semiconductor package, which can be assembled in a simplified manner and can reduce the manufacturing cost.

In an example, various aspects of the present invention provide a semiconductor package including a substrate having at least one semiconductor chip and an active element attached to a cavity region, and a window (e.g., a pocket of a molding) formed to surround the cavity region and made of a plastic material attached to the substrate through an adhesive.

In another example, various aspects of the present invention may provide a manufacturing method of a semiconductor package, the manufacturing method including, for example, preparing a mother board having N×M (where M may or may not equal N) package device arrays having at least one semiconductor chip and an active element attached to a cavity region, preparing N×M window (or pocket) arrays corresponding to the N×M package device arrays, coating an adhesive on adhering regions formed on the window arrays to be adhered to the mother board, adhering the window arrays to a target position on the mother board using the adhesive, and fabricating package devices by severing the package device arrays by a cutting process.

As described above, according to various aspects of the present invention, a lid for sealing a cavity region to which a semiconductor chip and an active element are attached may for example be formed of a window (or pocket) made of a plastic material enabling inject-molding, N×M package device arrays and N×M window arrays corresponding thereto may be adhered to each other, and the package device arrays (e.g., with window arrays adhered thereto) may be severed into discrete lidded devices by a cutting process, thereby manufacturing the semiconductor package. Accordingly, the assembling process of the semiconductor package can be streamlined and the manufacturing cost can be substantially reduced.

Figure 2:
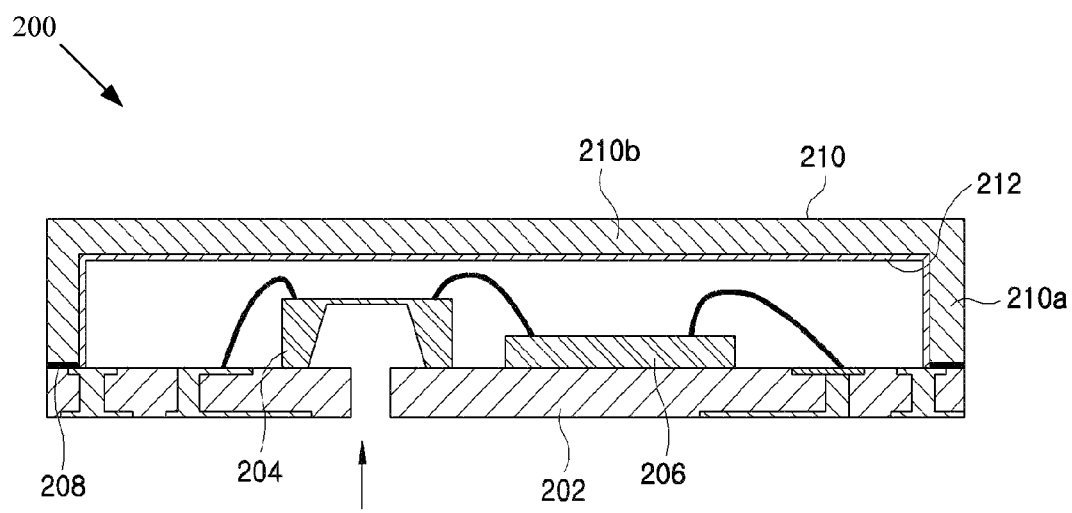
FIG. 2 shows a cross-sectional view of a semiconductor package in accordance with various aspects of the present invention.

Turning to FIG. 2, such figure shows a cross-sectional view of a semiconductor package 200 in accordance with various aspects of the present invention.

A semiconductor chip 204, such as for example a MEMS microphone device, and an active element 206, such as for example a controller, are attached to a cavity region on a substrate 202. The semiconductor chip 204 and the active element 206 are, for example, electrically connected to a circuit pattern (not shown) of the substrate 202 through a metal wire. Here, the arrow shown in FIG. 2 indicates a sound passage (or a sound groove).

The cavity region of the substrate 202, to which the semiconductor chip 204 and the active element 206 are attached, may be sealed by a window 210 (or pocket) made of a plastic material. The window 210 may be formed by a plastic injection process and may have a right-angle structure having a sidewall 210a and a top plate 210b formed at a right angle to each other.

Here, the window 210 and the substrate 202 may be adhered to each other using an adhesive 208, such as a solder paste or an epoxy paste. The adhesive 208 may be coated on an adhering region of the window 210 by, for example, screen printing.

In an example case where the semiconductor chip 204 attached to the cavity region is a device requiring EMI shielding, such as for example a MEMS microphone, an EMI shielding layer 212 may be formed within the window 210. The EMI shielding layer 212 may be formed of, for example, a copper/nickel dual plated layer, or any of a variety of other materials suitable for EMI shielding.

In the following discussion, process steps of a manufacturing method of the aforementioned semiconductor package 200 in accordance with various aspects of the present invention will be described.

Figure 3A:
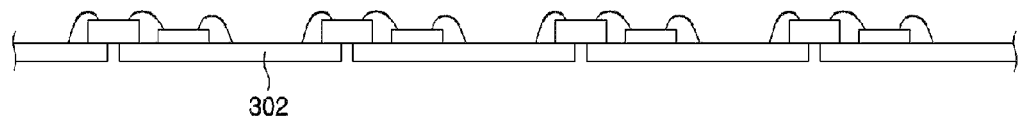
FIGS. 3A to 3C are diagrams illustrating process steps of a manufacturing method of a semiconductor package in accordance with various aspects of the present invention.
Figure 3B:
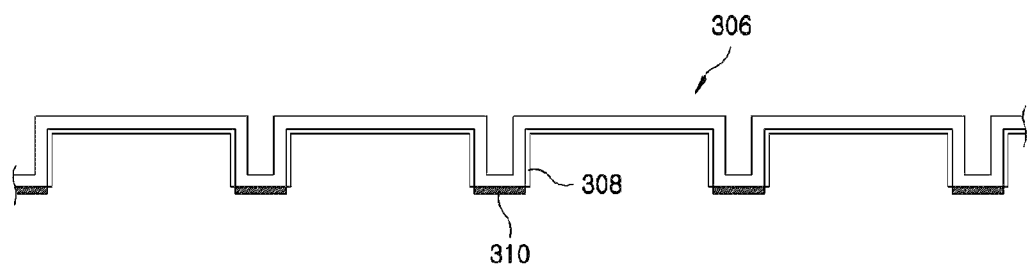
Figure 3C:
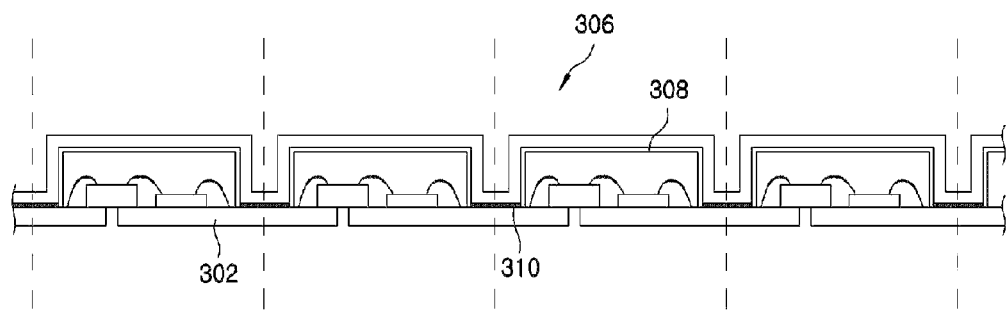
Figure 4:
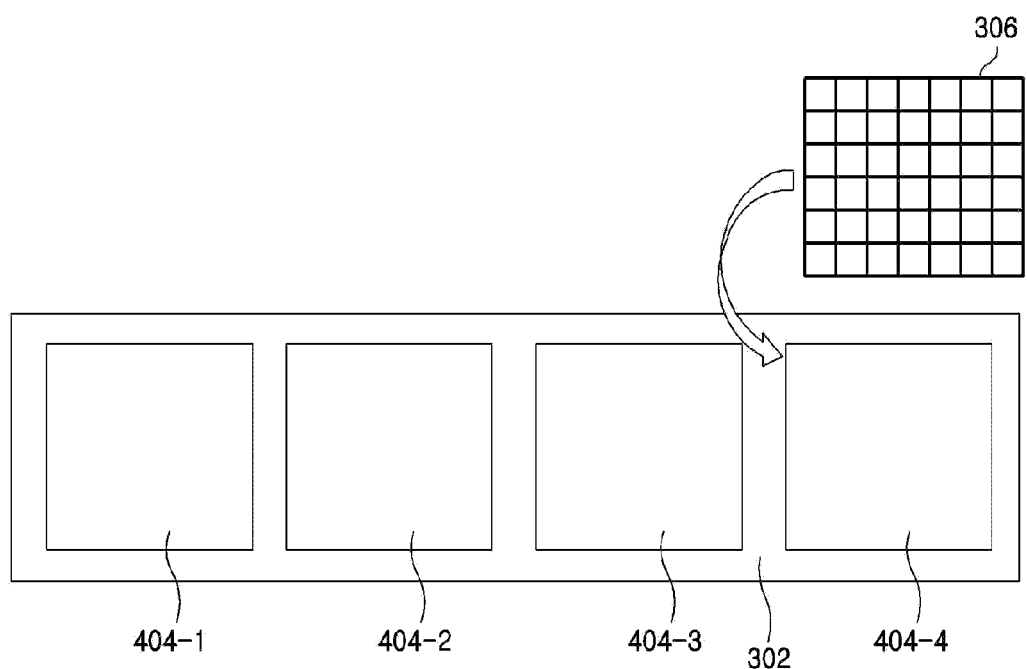
FIG. 4 illustrates an exemplary manufacturing method of a semiconductor package in accordance with various aspects of the present invention.

FIGS. 3A to 3C are diagrams illustrating process steps of a manufacturing method of a semiconductor package in accordance with various aspects of the present invention, and FIG. 4 illustrates an example manufacturing method of a semiconductor package in accordance with various aspects of the present invention.

Referring to FIG. 3A, a mother board 302 having N×M (where M might or might not equal N) package device arrays is prepared. In the mother board 302, at least one semiconductor chip (e.g., an MEMS microphone device) and an active element (e.g., a controller) are attached to a cavity region. As an example, as shown in FIG. 4, a plurality of N×M package device arrays 404-1 to 404-4 are formed on the mother board 302, for example distinctly separated from each other by a buffer region. Here, although not illustrated in FIG. 4, each of the N×M package device arrays 404-1 to 404-4 includes a plurality of package devices arrayed in a grid pattern.

Next, as an example, as shown in FIG. 3B, N×M window (or pocket) arrays 306 corresponding to the N×M package device arrays are prepared. The N×M window arrays may be fabricated using a plastic material by a plastic injection process. Here, the number of package devices constituting one package device array is equal to the number of windows constituting one window array, and each window has a right-angle structure having a sidewall and a top plate formed at a right angle to each other.

Next, a plating process is performed to form an EMI shielding layer 308 inside the windows constituting the N×M window arrays 306. The EMI shielding layer 308 may be formed of, for example, a copper/nickel dual plated layer, or other suitable EMI shielding material. Here, in a case where the semiconductor chip applied to each package device is a semiconductor device not requiring EMI shielding, the forming of the EMI shielding layer may be omitted.

Next, an adhesive 310 is coated on adhering regions of the respective window arrays to be adhered to the mother board 302 by, for example, screen printing. Here for example, a solder paste or an epoxy paste (e.g., a conductive epoxy paste) may be used as the adhesive 310.

Referring back to FIG. 3C, the adhesive 310 is allowed to face the mother board 302 to align the window arrays with the N×M package device arrays, followed by performing, for example, annealing, thereby adhering the window arrays 306 to target positions on the mother board 302.

Finally, a cutting (severing) process, for example using a blade or laser, is performed to sever the package device arrays into discrete package devices by cutting the package device arrays in a direction indicated by dotted lines shown in FIG. 3C, thereby completing fabrication of semiconductor packages.

Figure 5:
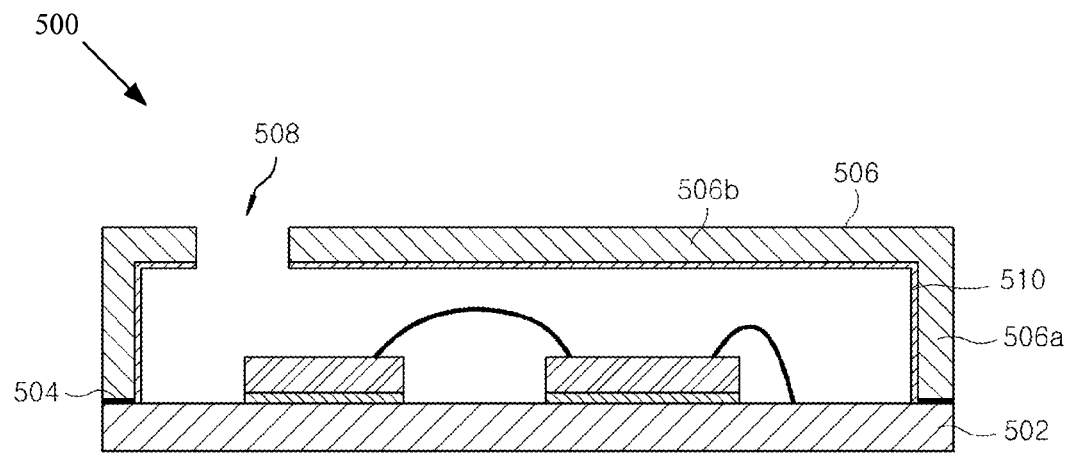
FIG. 5 is a sectional view of a semiconductor package in accordance with various aspects of the present invention.

FIG. 5 is a sectional view of a semiconductor package 500 in accordance with various aspects of the present invention. The example package 500 may, for example, share any or all characteristics with other semiconductor packages discussed herein (e.g., with regard to FIGS. 1 and 2), and may be produced in accordance with any or all production steps discussed herein (e.g. with regard to FIGS. 3 and 4). A semiconductor chip, such as a MEMS microphone device, and an active element, such as a controller, may be attached to a cavity region on a substrate 502. The semiconductor chip and the active element are electrically connected to a circuit pattern (not shown) of the substrate 502 through a metal wire or the like, through conductive bumps or pillars, etc.

The cavity region of the substrate 502, to which the semiconductor chip and the active element are attached, may be sealed by a window 506 (or pocket) made of a plastic material. As in the embodiment described above with reference to FIG. 2, the window 506 may be formed by a plastic injection process and may have a right-angle structure having a sidewall 506a and a top plate 506b formed at a right angle to each other. Here, a passage 508 is formed at one or more predetermined positions (for example, any one of each of the four corners, each of the four side surfaces, and middle portions in a case of a rectangular package structure) on the top plate 506b of the window 506. The passage 508 may function as a sound passage (sound groove) when the semiconductor chip is a MEMS microphone device.

Here, the window 506 (or pocket) and the substrate 502 may be adhered to each other using an adhesive 504, such as a solder paste or an epoxy paste. The adhesive 504 may be coated on an adhering region of the window 506 by, for example, screen printing.

An EMI shielding layer 510 may be formed within the window 506. The EMI shielding layer 510 may be formed to provide electromagnetic-wave shielding, for example when the semiconductor chip attached to the cavity region is a device such as a MEMS microphone or any other device that is sensitive to electromagnetic interference. The EMI shielding layer 510 may be formed of, for example, a copper/nickel dual plated layer.

As in the semiconductor package of the embodiment described above with reference to FIG. 2, the semiconductor package of this embodiment may, of course, be fabricated according to the method of preparing the N×N package element arrays and N×N window arrays corresponding thereto, and then severing the package element arrays into package elements through a cutting process.

Figure 6:
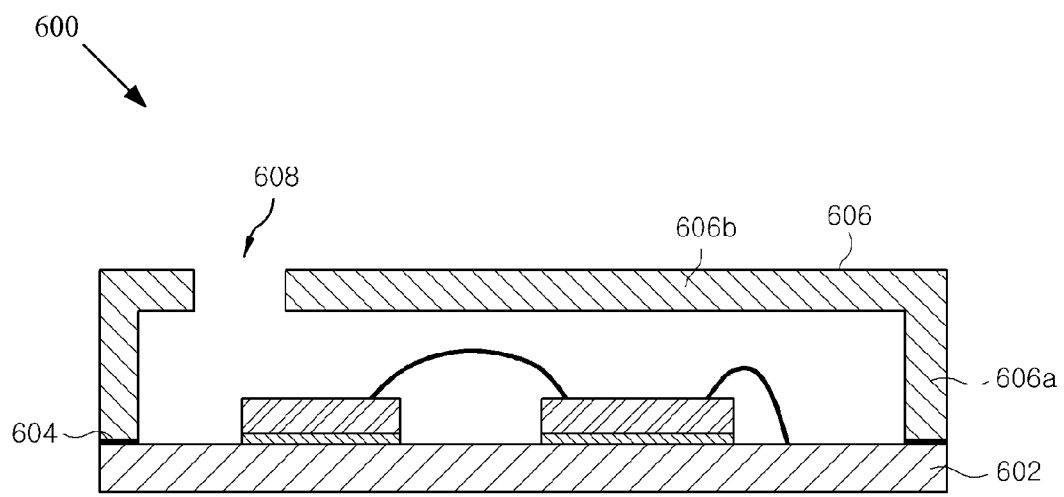
FIG. 6 is a sectional view of a semiconductor package in accordance with various aspects of the present invention.

FIG. 6 is a sectional view of a semiconductor package 600 in accordance with various aspects of the present invention. The semiconductor package of this embodiment may, for example, be substantially the same as the semiconductor package 500 of the example shown and described above with reference to FIG. 5. For example, the packages 500 and 600 may share the same package configuration, use the same material(s) for each constituent member, and be formed using the same package fabrication method, except that no EMI shielding layer is formed within the window 606.

For example, reference numeral 602 may correspond to reference numeral 502 of FIG. 5, reference numeral 604 may correspond to reference numeral 504 of FIG. 5, reference numeral 606 may correspond to reference numeral 506 of FIG. 5, reference numeral 606a may correspond to reference numeral 506a of FIG. 5, reference numeral 606b may correspond to reference numeral 506b of FIG. 5 and reference numeral 608 may correspond to reference numeral 508 of FIG. 5.

The semiconductor package 600 of this example, however, may differ from the example package 500 of FIG. 5 in that, for example, a pressure sensor device, an optical sensor device, or an infrared sensor device may be applied as a semiconductor chip attached to a cavity region. In this case, a passage 608 may function to sense and/or cancel a pressure difference between the outside of the package 600 and the inner cavity in which the semiconductor chip is positioned. Here, a pressure sensor device, an optical sensor device, an infrared sensor device, or the like may be defined as a MEMS element. At this time, when an optical sensor device, an infrared sensor device, or the like is utilized as the semiconductor chip, the size of the passage 608 may be required to increase relative to a similar passage for a MEMS microphone device.

In FIG. 6, an example in which the passage 608 sensing and/or canceling a pressure difference is formed at a predetermined position on a top plate 606b of the window 606 has been presented, but this positioning is merely an example. The passage 608 may, for example, be formed at a predetermined position in a substrate 602 to which no semiconductor chip or no active element is attached.

FIGS. 7A to 7D are sectional views of semiconductor packages in accordance with various aspects of the present invention. Though the packages illustrated in FIGS. 7A to 7D are presented to provide additional examples of various aspects of the present invention, such packages may share any or all characteristics with the other packages discussed herein.

Figure 7A:
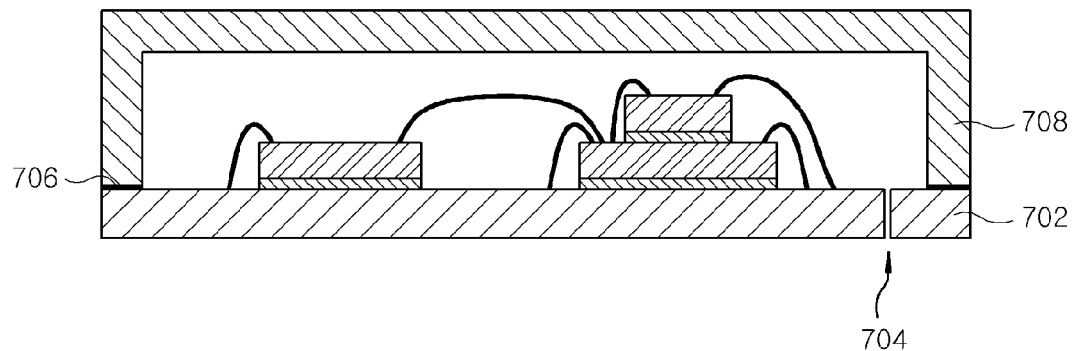
FIGS. 7A to 7D are sectional views of semiconductor packages in accordance with various aspects of the present invention.

Referring to FIG. 7A, a semiconductor chip such as a gyro sensor device, an acceleration sensor device, or a magnetic sensor device and an active element such as a controller may be attached with a one-layered structure or a multi-layered structure to the cavity region on a base 702. Circuit patterns (not shown) of the semiconductor chip, the active element, and the base 702 are electrically connected to each other through metal wires, conductive bumps or pillars, etc. Here, the base 702 may be, for example, a PCB substrate, polymer, a polymer lead, etc.

In this example, an air ventilation opening 704 of a minute structure (for example, a minute structure with a diameter of 0.3 mm or less) is formed at a predetermined position (for example, a position at which an air passage is not blocked by the semiconductor chip or the active element) in the base 702. The air ventilation opening 704 forms an air flow passage with the outside, and thus serves as an opening that prevents the base 702 from being completely and/or partially detached and from being swollen or otherwise deformed due to expansion of internal pressure when the window 708 is attached to the base 702.

The cavity region to which the semiconductor chip, the active element, and the like are attached with a one-layered structure or a multi-layered structure is sealed by the window 708 (or pocket) made of a plastic material. The window 708 may, for example, be fabricated by a plastic injection process, as in the example described above with reference to FIG. 2. Here, the window 708 and the base 702 may, for example, be adhered to each other using an adhesive 706, such as a solder paste or an epoxy paste. The adhesive 706 may, for example, be coated on an adhering region of the window 708 by, for example, screen printing.

Figure 7B:
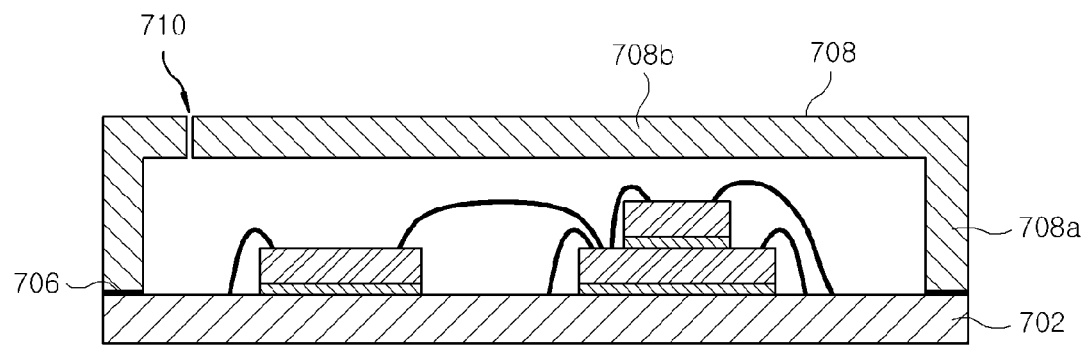

Referring now to FIG. 7B, the semiconductor package in FIG. 7B is different from the semiconductor package in FIG. 7A in that the air ventilation opening forming the air flow passage with the outside is formed at the predetermined position on a top plate 708b (or top surface of a window) of the base 702, and otherwise is substantially the same as the semiconductor package shown in FIG. 7A in the remaining configuration and the material of each constituent member. In FIG. 7B, reference numeral 708a denotes a sidewall of the top plate 708b of the window 708 (or pocket). Here, an air ventilation opening 710 with a minute structure formed in the top plate 708b of the window 708 may be formed at any one or more of each of the four corners, each of the four side surfaces or sidewalls, and middle portions in a case of a rectangular package structure.

Figure 7C:
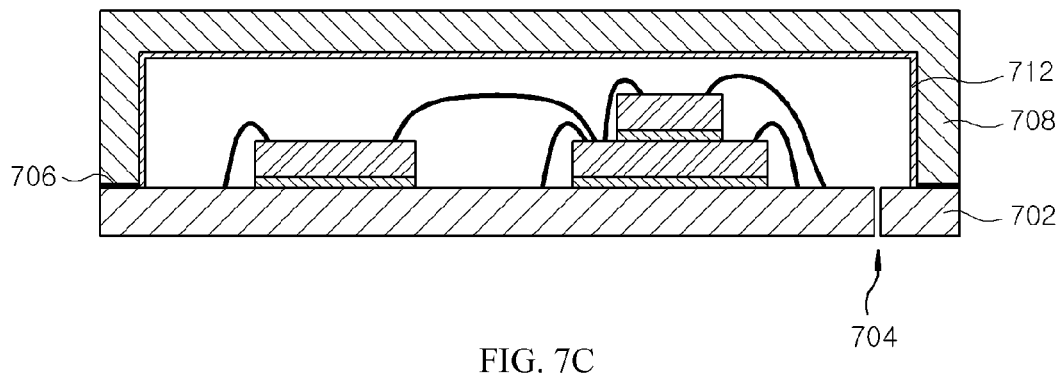
Figure 7D:
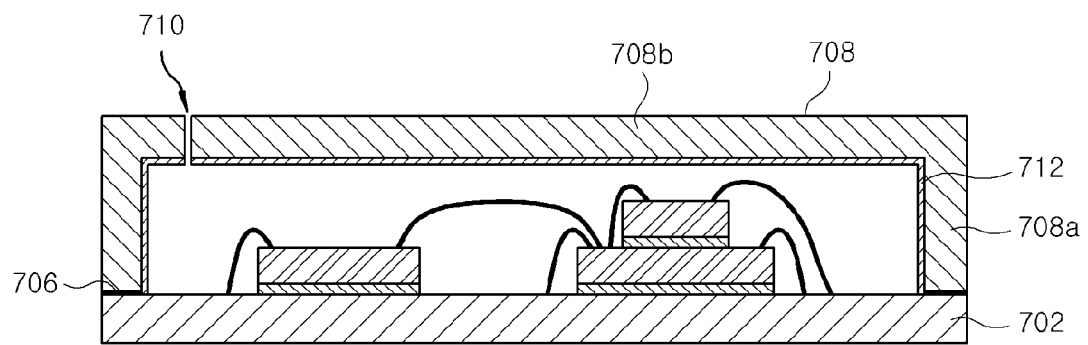

The example semiconductor packages of the embodiments shown in FIGS. 7A and 7B might or might not have an EMI shielding layer as discussed elsewhere herein. For example, as shown in FIGS. 7C and 7D, an EMI shielding layer 712 may be formed within the window 708 (or pocket), as shown in each of FIGS. 7C and 7D. The EMI shielding layer 712 may, for example, be beneficial when a semiconductor chip attached to a cavity region is a device (for example, a MEMS microphone device) that would benefic from electromagnetic-wave shielding. Here, the EMI shielding layer 712 may be formed of, for example, a copper/nickel dual plated layer, as in the semiconductor package shown in FIG. 5 and discussed previously.

Additionally, as in the example semiconductor packages discussed previously, for example with reference to FIG. 2, each of the example semiconductor packages illustrated in FIGS. 7A-7D may be fabricated according to the method of preparing the N×N package element arrays and N×N window arrays corresponding thereto, and then severing the package element arrays, for example with attached window arrays, into package elements through a cutting process. Non-limiting examples of such processing were presented earlier, for example with regard to FIGS. 3-4.

Non-limiting illustrative examples of a device package and/or method for producing a device package have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present disclosure as set forth in the following claims.

What is claimed is:

1. A method for producing a semiconductor package, the manufacturing method comprising:
   preparing a mother board having a plurality of N×M package device arrays, each package device of the package device arrays comprising at least one semiconductor chip and an active element attached to the mother board;
   preparing a plurality of N×M window arrays corresponding to the package device arrays, each window of the window arrays comprising sidewalls forming cavity regions for the package device arrays;
   coating an adhesive on adhering regions formed on the window arrays to be adhered to the mother board;
   adhering the window arrays to a target position on the mother board using the adhesive; and
   fabricating lidded package devices by severing the package device arrays and adhered window arrays by a cutting process.

2. The method of claim 1, wherein said preparing a plurality of N×M window arrays comprises molding the window arrays from plastic.

3. The method of claim 2, wherein said preparing a plurality of N×M window arrays comprises forming an EMI shielding layer at least inside respective windows of the window arrays.

4. The method of claim 3, wherein said forming an EMI shielding layer comprises forming the EMI shielding layer by, at least in part, plating a copper/nickel layer.

5. The method of claim 1, wherein the semiconductor chip is a MEMS microphone device.

6. The method of claim 1, wherein the sidewalls and a top plate of each window of the window arrays are at a right angle to each other.

7. The method of claim 1, wherein the adhesive is a solder paste.

8. The method of claim 1, wherein said coating an adhesive comprises screen printing the adhesive on the window arrays.

9. The method of claim 1, wherein N is different from M.

10. A method for producing a semiconductor package, the manufacturing method comprising:
    preparing a mother board having an N×M package device array, each package device of the package device array comprising at least one semiconductor chip and an active element attached to the mother board;
    providing a molded N×M window array corresponding to the package device array, each window of the window array comprising sidewalls forming cavity regions for the package device arrays and an electromagnetic interference (EMI) shielding layer inside said each window;
    coating an adhesive on adhering regions formed on the window array to be adhered to the mother board;
    adhering the window array to a target position on the mother board using the adhesive; and
    fabricating lidded package devices by severing the package device array and adhered window array by a cutting process.

11. The method of claim 10, wherein said molding an N×M window array comprises injection molding the window array from plastic.

12. The method of claim 10, wherein said forming an EMI shielding layer comprises forming the EMI shielding layer by, at least in part, plating a copper/nickel layer.

13. The method of claim 10, wherein the semiconductor chip is a MEMS microphone device.

14. The method of claim 13, wherein the active element is a controller.

15. The method of claim 13, wherein the sidewalls and a top plate of each window of the window arrays are at a right angle to each other.

16. The method of claim 13, wherein the adhesive is a solder paste.

17. The method of claim 13, wherein the adhesive is an epoxy paste.

18. The method of claim 1, wherein said coating an adhesive comprises screen printing the adhesive on the window array.

19. The method of claim 1, wherein N is different from M.

20. A method for producing a semiconductor package, the manufacturing method comprising:
    preparing a mother board having an N×M package device array, each package device of the package device array having at least one semiconductor chip and an active element attached to the mother board in a respective cavity region;
    providing a molded N×M window array corresponding to the package device array, wherein at least one groove separates adjacent windows of the window array and each window of the window array comprising sidewalls for each of the respective cavity regions;
    coating an adhesive on adhering regions formed on the window array to be adhered to the mother board;
    adhering the window array to a target position on the mother board using the adhesive; and
    fabricating lidded package devices by severing the package device array and adhered window array by a cutting process.

* * * * *